TEMPERATURE-EQUALIZING MOUNTING FOR ELECTRICAL COMPONENTS SUCH AS TRANSISTORS

Filed March 4, 1966

INVENTORS:
Fabrizio Trincossi
Alberto Braghieri
BY
Karl G. Ross
Attorney

United States Patent Office 3,411,049
Patented Nov. 12, 1968

3,411,049
TEMPERATURE-EQUALIZING MOUNTING FOR ELECTRICAL COMPONENTS SUCH AS TRANSISTORS

Fabrizio Trincossi, Genoa, and Alberto Braghieri, Milan, Italy, assignors to Societa Italiana Telecomunicazioni Siemens S.p.A., Milan, Italy, a corporation of Italy Continuation-in-part of application Ser. No. 527,340, Feb. 14, 1966. This application Mar. 4, 1966, Ser. No. 531,659
Claims priority, application Italy, Feb. 12, 1965, 2,916/65
10 Claims. (Cl. 317—234)

This application is a continuation-in-part of an application Ser. No. 527,340 filed Feb. 14, 1966, now abandoned.

Our present invention relates to a mounting for electrical components, such as transistors, which in operation are to be subjected to virtually identical thermal conditions in order to insure proper performance.

If, for example, two transistors are interconnected in push-pull to constitute a balanced amplifier, the electrical mid-point of the circuit may shift unless these transistors are maintained at the same temperature level. Hitherto, this condition was satisfied by mounting such transistors in a common chamber, yet that solution entails certain disadvantages such as difficulty of access and problems in maintaining the necessary insulation between these transistors as well as between their respective leads. If, on the other hand, separate holders are used for the paired transistors, their characteristics must be as nearly equal as possible in order that the energy dissipated in these transistor should subject them to the same degree of heating and should not lead to electrical unbalancing due to different amplification of the input signals.

It is, therefore, the general object of our invention to provide a mounting for a plurality of electrical components, specifically a pair of transistors of possibly dissimilar characteristics, which facilitates temperature equalization among these components while leaving them individually accessible for inspection, repair or replacement.

A more particular object of this invention is to provide a mounting of this description which also affords a high degree of thermal insulation toward the surrounding atmosphere and at the same time is sufficiently massive to dissipate heat surges developing in the operation of the transistors or other electrical components accommodated by it.

This object is realized, in accordance with our present invention, by the provision of a metallic body which has a surface provided with as many juxtaposed recesses as there are electrical components to be accommodated, i.e. two such recesses in the specific instance of a pair of transistors to which our invention is primarily directed. Each recess has disposed therein, with clearance, a metallic retaining cap which has an open end for the insertion of the respective component and which at its other end is fastened to the body with interposition of a thin layer of dielectric material; thus there exists an almost continuous path of thermally conductive material, i.e. metal, between the several components engaged by these caps. In order to supplement this metallic path, we introduce an electrically insulating but thermally conductive fluid mass, preferably a silicone oil, into each recess to fill the clearance existing between the walls thereof and the associated cap; a dielectric closure member, such as a flat base plate, is then placed in contact with the recessed surface of the metallic body to hold the electrical components in position and to prevent the escape of the fluid mass.

The arrangement so far described affords the dual advantage of equalizing the temperature levels at the several components and providing a structure of relatively large thermal capacity adapted to dissipate the heat developed during operation. A third advantage, i.e. the substantial heat insulation of the components from the surrounding atmosphere to minimize the influence of changes in ambient temperature upon their operation, is attained by enveloping the metallic body in a dielectric casing which complements the base plate in forming a substantially continuous thermally nonconductive enclosure around the body and the electrical components received therein. Small performations in the base plate may serve for the passage of leads extending from the several transistor electrodes.

The invention will be described in greater detail with reference to the accompanying drawing in which.

Figure 1:
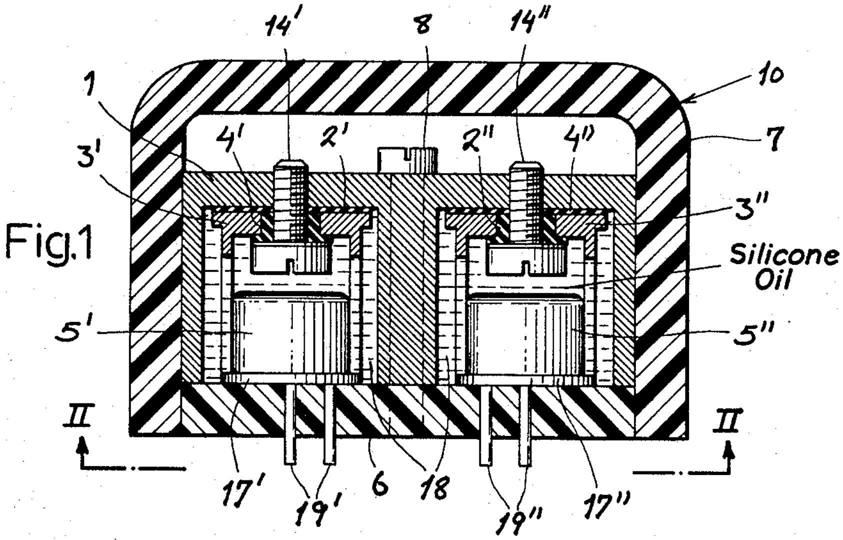
FIG. 1 is a sectional elevational view of a mounting in accordance with a preferred embodiment.
Figure 3:
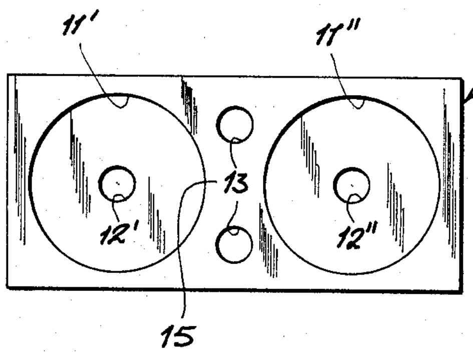
FIG. 3 is a bottom view of a metallic body forming part of the mounting of FIG 1.

In FIG. 1 we have shown a mounting 10 for a pair of electrical components, i.e. two transistors 5′ and 5″, which are to be held in heat-exchanging relationship with each other but with good thermal insulation toward the surrounding atmosphere. For this purpose the mounting 10 includes a metallic body 1, preferably of aluminum, formed with a pair of cylindrical recesses 11′, 11″ (see also FIG. 3), each of these recesses being partly occupied by a metallic cap 3′, 3″ received therein with all-around annular clearance. Disks 2′, 2″ of insulating material are disposed at the upper end of each recess and serve as spacers which electrically separate the body 1 from the caps 3′, 3″; this otherwise closed upper end is formed with a threaded bore 12′, 12″ engaged by a respective fastening screw 14′, 14″ which is surrounded by a dielectric bushing 4′, 4″ insulating it from the associated cap. A pair of bolts 8 (only one shown) pass through bores 13 in a central wall portion 15 of body 1 and threadedly engage a base plate 6 which supports the transistors 5′, 5″ and which is maintained in firm contact with the undersurface of body 1 to seal the recesses 11′ and 11″.

Figure 4:
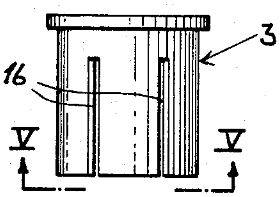
FIG. 4 is a side-elevational view of a retaining cap receivable in the body of FIG. 3.
Figure 5:
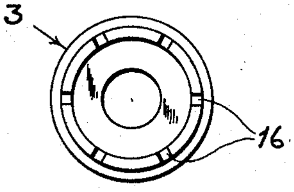
FIG. 5 is a bottom view of the cap taken on the line V—V of FIG. 4.

As best seen in FIGS. 4 and 5, which show an element 3 representative of either cap 3′, 3″, these caps are provided with longitudinal slits 16 terminating at the open end of the cap; the slitted rim of the cap, which may be of steel or other suitable metal, resiliently grips the peripheral wall of the associated transistors 5′, 5″ and abuts a shoulder 17′, 17″ of the transistor which limits the intrusion of the latter into the interior of the cap. The transistors 5′, 5″ are therefore separated from the screws 14′, 14″ by an air space which, along with the clearances surrounding the cap, is occupied by an electrically insulating but thermally conductive fluid mass 18, such as silicone oil, penetrating through the slits 16.

Figure 2:
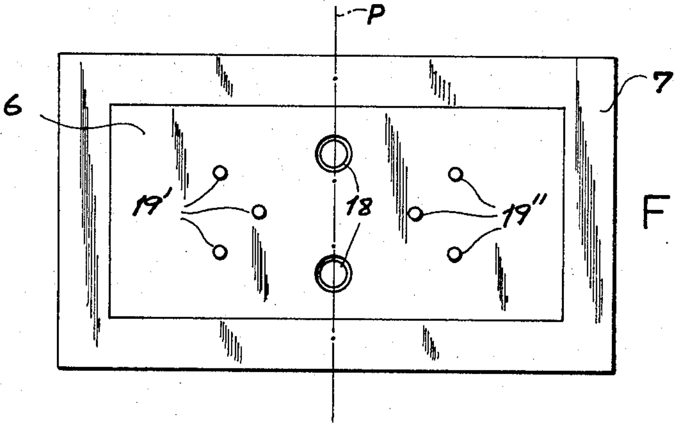
FIG. 2 is a bottom view of the mounting taken on the line II—II of FIG. 1.

The mounting 10 is completed by an insulating casing 7 which, together with base plate 6, forms an enclosure of rectangular profile around body 1 as best seen in FIG. 2. Base plate 6 is formed with small holes 18′, 18″ through which pass electrode leads 19′, 19″ of the transistors 5′ and 5″. Body 1 is separated from the cap of casing 7 by an air space which accommodates the ends of screws 14′, 14″ and the heads of bolts 8.

We have found that our improved mounting, when used in conjunction with ordinary commercial silicon transistors, limits drifts of the output voltage with reference to the input voltage in response to changes of ambient temperature to only about 10 μv. per ° C., this deviation being negligible in the case of input signals on the order of millivolts.

The arrangement shown in the drawing is laterally symmetrical, with the transistors 5', 5'' disposed at equal distance from a median transverse plane P. Naturally, the invention in its broader aspects is not limited to transistors, nor to the accommodation of only two components, and the construction specifically described and illustrated may be modified in various details without departing from the spirit and scope of our invention as defined in the appended claims.

We claim:

1. A temperature-equalizing mounting for a plurality of electrical components, comprising:

a metallic body having a surface provided with a plurality of juxtaposed recesses for the accommodation of respective electrical components;

a metallic retaining cap in each of said recesses having an end open toward said surface for the insertion of a component to be accommodated, said cap being positioned in its recess with clearance from the walls thereof;

fastening means securing an opposite end of said cap to said body with interposition of thin layer of dielectric material;

a fluid mass of thermally conductive but electrically insulating material occupying each recess and filling the clearance between said walls and said cap; and a dielectric closure member abutting said body along said surface and overlying said recesses for holding the components thereof in position and preventing the escape of said fluid mass.

2. A mounting as defined in claim 1 wherein said cap is provided at its open end with a longitudinally slitted rim adapted to grip a substantially cylindrical surface of the associated component.

3. A mounting as defined in claim 1 wherein said closure member is a plate provided with holes for the passage of leads extending from said components.

4. A mounting as defined in claim 3, further comprising a dielectric casing complementing said plate in forming a substantially continuous thermally insulating enclosure around said body.

5. A mounting as defined in claim 4 wherein said enclosure is of generally rectangular outline, said recess being two in number and being symmetrically disposed on opposite sides of a transverse median plane of said outline.

6. In combination, a mounting as defined in claim 5 and a pair of transistors respectively received in said recesses.

7. The combination defined in claim 6 wherein each of said transistors extends only partly into its retaining cap and has a peripheral shoulder engaging the rim of said cap, said fastening means including a metallic screw projecting into said cap in spaced relationship with the associated transistor.

8. The combination defined in claim 7 wherein said cap is provided with peripheral slits penetrated by said fluid mass, the latter also filling the free space in said cap unoccupied by the associated transistor.

9. A mounting as defined in claim 5 wherein said recesses are separated from each other by a common intermediate wall portion of said body, further comprising bolt means traversing said wall portion and removably attaching said plate to said body.

10. A mounting as defined in claim 1 wherein said fluid mass is a silicone oil.

References Cited

UNITED STATES PATENTS

| | | | |
|---|---|---|---|
| 3,257,621 | 6/1966 | Jadoul | 317—234.1 |
| 3,299,331 | 1/1967 | Lacy | 317—234.1 |

JOHN W. HUCKERT, *Primary Examiner.*

R. F. POLISSACK, *Assistant Examiner.*